US008759664B2

(12) United States Patent
Kanto et al.

(10) Patent No.: US 8,759,664 B2
(45) Date of Patent: Jun. 24, 2014

(54) THIN FILM SOLAR CELL STRINGS

(75) Inventors: Eric Kanto, Tucson, AZ (US); Scott Wiedeman, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 249 days.

(21) Appl. No.: 12/976,911

(22) Filed: Dec. 22, 2010

(65) Prior Publication Data
US 2012/0006378 A1    Jan. 12, 2012

Related U.S. Application Data

(60) Provisional application No. 61/284,924, filed on Dec. 28, 2009, provisional application No. 61/284,958, filed on Dec. 28, 2009, provisional application No. 61/284,956, filed on Dec. 28, 2009.

(51) Int. Cl.
*H01L 31/05* (2014.01)
(52) U.S. Cl.
CPC ............ *H01L 31/05* (2013.01); *H01L 31/0504* (2013.01); *H01L 31/0508* (2013.01)
USPC ....................................... 136/244
(58) Field of Classification Search
CPC .. H01L 31/05; H01L 31/0504; H01L 31/0508
USPC ....................................... 136/244
See application file for complete search history.

(56) References Cited

U.S. PATENT DOCUMENTS

| | | |
|---|---|---|
| 3,553,030 A | 1/1971 | Lebrun |
| 4,064,552 A | 12/1977 | Angelucci et al. |
| 4,221,465 A | 9/1980 | Hannan et al. |
| 4,254,546 A | 3/1981 | Ullery, Jr. |
| 4,318,938 A | 3/1982 | Barnett et al. |

(Continued)

FOREIGN PATENT DOCUMENTS

| | | |
|---|---|---|
| DE | 3423172 A1 | 1/1985 |
| DE | 212009000025 U1 | 10/2010 |

(Continued)

OTHER PUBLICATIONS

Schwertheim et al., "Lead-free electrically conductive adhesives for solar cell interconnectors", Aug. 29, 2008; 3 pages, http://www.fernunihagen.de/LGBE/papers/2007/revpaper.pdf.

(Continued)

*Primary Examiner* — Eli Mekhlin
*Assistant Examiner* — Dujuan Horton
(74) *Attorney, Agent, or Firm* — Kolisch Hartwell, P.C.

(57) ABSTRACT

Thin film PV cells and strings of such cells that may be electrically joined with electrical conductors or electroconductive patterns are disclosed. The electrical conductors wrap or fold around the PV cells to form an electrical series connection among those cells. The electrical conductors may be formed or deposited on an electrically insulating sheet, which is then wrapped or folded around those cells. By constructing the electrical conductor and positioning the cells appropriately, an electrical connection is formed between one polarity of a given cell and the opposite polarity of the adjacent cell when the sheet is folded over. One or more dielectric materials may be applied or attached to exposed edges of the cells or conductive traces prior to folding the electrical conductors and/or electrically insulating sheet to prevent shorts or failure points.

11 Claims, 4 Drawing Sheets

(56) References Cited

U.S. PATENT DOCUMENTS

| | | |
|---|---|---|
| 4,400,577 A | 8/1983 | Spear |
| 4,430,519 A | 2/1984 | Young |
| 4,537,838 A | 8/1985 | Jetter et al. |
| 4,542,255 A | 9/1985 | Tanner et al. |
| 4,609,770 A | 9/1986 | Nishiura et al. |
| 4,617,420 A | 10/1986 | Dilts et al. |
| 4,617,421 A | 10/1986 | Nath et al. |
| 4,642,413 A | 2/1987 | Ovshinsky |
| 4,652,693 A * | 3/1987 | Bar-On .................. 136/251 |
| 4,663,828 A | 5/1987 | Hanak |
| 4,663,829 A | 5/1987 | Hartman et al. |
| 4,697,041 A | 9/1987 | Okaniwa et al. |
| 4,698,455 A | 10/1987 | Cavicchi et al. |
| 4,713,493 A | 12/1987 | Ovshinsky |
| 4,737,379 A | 4/1988 | Hudgens et al. |
| 4,746,618 A | 5/1988 | Nath et al. |
| 4,773,944 A | 9/1988 | Nath et al. |
| 4,783,421 A | 11/1988 | Carlson et al. |
| 4,965,655 A | 10/1990 | Grimmer et al. |
| 5,021,099 A | 6/1991 | Kim et al. |
| 5,118,361 A | 6/1992 | Fraas et al. |
| 5,127,964 A | 7/1992 | Hamakawa et al. |
| 5,176,758 A | 1/1993 | Nath et al. |
| 5,181,968 A | 1/1993 | Nath et al. |
| 5,185,042 A | 2/1993 | Ferguson |
| 5,254,179 A | 10/1993 | Ricaud et al. |
| 5,268,037 A | 12/1993 | Glatfelter |
| 5,273,608 A | 12/1993 | Nath |
| 5,385,848 A | 1/1995 | Grimmer |
| 5,391,235 A | 2/1995 | Inoue |
| 5,409,549 A | 4/1995 | Mori |
| 5,419,781 A | 5/1995 | Hamakawa et al. |
| 5,457,057 A | 10/1995 | Nath et al. |
| 5,460,659 A | 10/1995 | Krut |
| 5,474,621 A | 12/1995 | Barnard |
| 5,534,094 A | 7/1996 | Arjavalingam et al. |
| 5,547,516 A | 8/1996 | Luch |
| 5,728,230 A | 3/1998 | Komori et al. |
| 5,735,966 A | 4/1998 | Luch |
| 5,928,437 A | 7/1999 | Dillard |
| 6,148,570 A | 11/2000 | Dinwoodie et al. |
| 6,239,352 B1 | 5/2001 | Luch |
| 6,310,281 B1 | 10/2001 | Wendt et al. |
| 6,372,538 B1 | 4/2002 | Wendt et al. |
| 6,414,235 B1 | 7/2002 | Luch |
| 6,459,032 B1 | 10/2002 | Luch |
| 6,479,744 B1 | 11/2002 | Tsuzuki et al. |
| 6,653,718 B2 | 11/2003 | Leung et al. |
| 6,690,041 B2 | 2/2004 | Armstrong et al. |
| 6,706,963 B2 | 3/2004 | Gaudiana et al. |
| 7,122,398 B1 | 10/2006 | Pichler |
| 7,176,543 B2 | 2/2007 | Beernink |
| 7,194,197 B1 | 3/2007 | Wendt et al. |
| 7,256,140 B2 | 8/2007 | Call et al. |
| 7,365,266 B2 | 4/2008 | Heckeroth |
| 7,432,438 B2 | 10/2008 | Rubin et al. |
| 7,485,474 B2 | 2/2009 | Call et al. |
| 7,498,508 B2 | 3/2009 | Rubin et al. |
| 7,507,903 B2 | 3/2009 | Luch |
| 7,517,465 B2 | 4/2009 | Guha et al. |
| 7,635,810 B2 | 12/2009 | Luch |
| 7,638,353 B2 | 12/2009 | Beernink et al. |
| 7,732,243 B2 | 6/2010 | Luch |
| 7,851,700 B2 | 12/2010 | Luch |
| 7,868,249 B2 | 1/2011 | Luch |
| 7,898,053 B2 | 3/2011 | Luch |
| 7,898,054 B2 | 3/2011 | Luch |
| 7,932,124 B2 | 4/2011 | Brabec et al. |
| 7,964,476 B2 | 6/2011 | Liu et al. |
| 7,989,692 B2 | 8/2011 | Luch |
| 7,989,693 B2 | 8/2011 | Luch |
| 8,062,922 B2 | 11/2011 | Britt et al. |
| 8,076,568 B2 | 12/2011 | Luch et al. |
| 8,110,737 B2 | 2/2012 | Luch |
| 8,114,702 B2 | 2/2012 | Gilman |
| 8,138,413 B2 | 3/2012 | Luch et al. |
| 8,198,696 B2 | 6/2012 | Luch |
| 8,202,368 B2 | 6/2012 | Britt et al. |
| 8,222,513 B2 | 7/2012 | Luch |
| 8,304,646 B2 | 11/2012 | Luch |
| 8,319,097 B2 | 11/2012 | Luch |
| 2001/0015220 A1 | 8/2001 | Benz et al. |
| 2003/0213974 A1 | 11/2003 | Armstrong et al. |
| 2004/0069340 A1 | 4/2004 | Luch |
| 2005/0000561 A1 | 1/2005 | Baret et al. |
| 2005/0121067 A1 | 6/2005 | Toyomura et al. |
| 2005/0176270 A1 | 8/2005 | Luch |
| 2006/0032752 A1 | 2/2006 | Luch |
| 2006/0157103 A1 | 7/2006 | Sheats et al. |
| 2006/0174930 A1 | 8/2006 | Murphy et al. |
| 2006/0180195 A1 | 8/2006 | Luch |
| 2007/0095384 A1 | 5/2007 | Farquhar et al. |
| 2007/0253686 A1 | 11/2007 | Wendt et al. |
| 2007/0283996 A1 | 12/2007 | Hachtmann et al. |
| 2007/0283997 A1 | 12/2007 | Hachtmann et al. |
| 2008/0011350 A1 | 1/2008 | Luch |
| 2008/0023069 A1 | 1/2008 | Terada et al. |
| 2008/0053512 A1 | 3/2008 | Kawashima |
| 2008/0090022 A1 | 4/2008 | Ovshinsky |
| 2008/0099063 A1 | 5/2008 | Armstrong et al. |
| 2008/0121265 A1 | 5/2008 | Hishida et al. |
| 2008/0202577 A1 | 8/2008 | Hieslmair |
| 2008/0227236 A1 | 9/2008 | Luch |
| 2008/0257399 A1 | 10/2008 | Wong et al. |
| 2008/0314433 A1 | 12/2008 | Luch |
| 2009/0014058 A1 | 1/2009 | Croft et al. |
| 2009/0107538 A1 | 4/2009 | Luch |
| 2009/0111206 A1 | 4/2009 | Luch |
| 2009/0145551 A1 | 6/2009 | Luch |
| 2009/0169722 A1 | 7/2009 | Luch |
| 2009/0173374 A1 | 7/2009 | Luch |
| 2009/0223552 A1 | 9/2009 | Luch |
| 2009/0255469 A1 | 10/2009 | Britt et al. |
| 2009/0255565 A1 | 10/2009 | Britt et al. |
| 2009/0269877 A1 | 10/2009 | Pinarbasi et al. |
| 2009/0272436 A1 | 11/2009 | Cheung |
| 2009/0293941 A1 | 12/2009 | Luch |
| 2009/0314330 A1 | 12/2009 | Saha et al. |
| 2010/0108118 A1 | 5/2010 | Luch |
| 2010/0147356 A1 | 6/2010 | Britt |
| 2010/0193367 A1 | 8/2010 | Luch |
| 2010/0218824 A1 | 9/2010 | Luch |
| 2010/0224230 A1 | 9/2010 | Luch et al. |
| 2010/0229942 A1 | 9/2010 | Luch |
| 2010/0269902 A1 | 10/2010 | Luch et al. |
| 2010/0313946 A1 | 12/2010 | Higuchi et al. |
| 2011/0056537 A1 | 3/2011 | Luch |
| 2011/0067754 A1 | 3/2011 | Luch |
| 2011/0070678 A1 | 3/2011 | Luch |
| 2012/0000502 A1 | 1/2012 | Wiedeman et al. |
| 2012/0000510 A1 | 1/2012 | Wiedeman et al. |
| 2012/0171802 A1 | 7/2012 | Luch et al. |
| 2012/0322194 A1 | 12/2012 | Luch |
| 2013/0037074 A1 | 2/2013 | Britt et al. |
| 2013/0052769 A1 | 2/2013 | Luch |
| 2013/0240011 A1 | 9/2013 | Luch |
| 2013/0255744 A1 | 10/2013 | Luch |
| 2013/0255746 A1 | 10/2013 | Luch et al. |
| 2013/0255771 A1 | 10/2013 | Luch |

FOREIGN PATENT DOCUMENTS

| | | |
|---|---|---|
| EP | 0111394 | 6/1984 |
| JP | 51-110985 A | 9/1976 |
| WO | 2005077062 A2 | 8/2005 |
| WO | 2009006230 | 1/2009 |
| WO | 2009097161 A1 | 8/2009 |
| WO | 2010039245 A1 | 4/2010 |
| WO | 2011090723 A2 | 7/2011 |
| WO | 2013158796 A1 | 10/2013 |

OTHER PUBLICATIONS

The International Bureau of WIPO, International Preliminary Report on Patentablily regarding PCT Application No. PCT/US2009/000690, Aug. 3, 2010, 8 pages.

(56) References Cited

OTHER PUBLICATIONS

U.S. Patent and Trademark Office, Office Action regarding U.S. Appl. No. 12/364,440, Apr. 5, 2011, 23 pages.
U.S. Patent and Trademark Office, Office action regarding U.S. Appl. No. 12/980,151, Jul. 31, 2013, 19 pages.
U.S. Patent and Trademark Office, Office action regarding U.S. Appl. No. 12/980,201, Jul. 15, 2013, 25 pages.
U.S. Receiving Office, International Search Report and Written Opinion of the International Searching Authority regarding PCT Patent Application No. PCT/US2009/005418, Dec. 17, 2009, 7 pages.
The International Bureau of WIPO, International Preliminary Report on Patentability regarding PCT Patent Application No. PCT/US2009/000690, Aug. 3, 2010, 7 pages.
U.S. Receiving Office, International Search Report and Written Opinion of the International Searching Authority regarding PCT Patent Application No. PCT/US2010/062253, Mar. 29, 2011, 12 pages.
The International Bureau of WIPO, International Preliminary Report on Patentability regarding PCT Patent Application No. PCT/US2009/005418, Apr. 5, 2011, 6 pages.
U.S. Patent and Trademark Office, Office action regarding U.S. Appl. No. 12/364,440, Nov. 29, 2011, 18 pages.
U.S. Receiving Office, International Search Report and Written Opinion of the International Searching Authority regarding PCT Patent Application No. PCT/US2010/062259, May 2, 2012, 16 pages.
The International Bureau of WIPO, International Preliminary Report on Patentability regarding PCT Patent Application No. PCT/US2010/062253, Jul. 4, 2012, 8 pages.
The International Bureau of WIPO, International Preliminary Report on Patentability regarding PCT Patent Application No. PCT/US2010/062259, Jul. 4, 2012, 12 pages.
U.S. Patent and Trademark Office, Office action regarding U.S. Appl. No. 12/587,111, Aug. 28, 2012, 20 pages
U.S. Patent and Trademark Office, Office action regarding U.S. Appl. No. 12/980,201, Dec. 6, 2012, 20 pages.
U.S. Patent and Trademark Office, Office action regarding U.S. Appl. No. 12/980,151, Dec. 13, 2012, 25 pages.
U.S. Patent and Trademark Office, Office action regarding U.S. Appl. No. 12/587,111, Mar. 14, 2013, 21 pages.
U.S. Receiving Office, International Search Report and Written Opinion of the International Searching Authority regarding PCT Patent Application No. PCT/US2013/037024, Aug. 13, 2013, 13 pages.
U.S. Patent and Trademark Office, Office action regarding U.S. Appl. No. 13/482,699, Dec. 24, 2013, 31 pages.

* cited by examiner

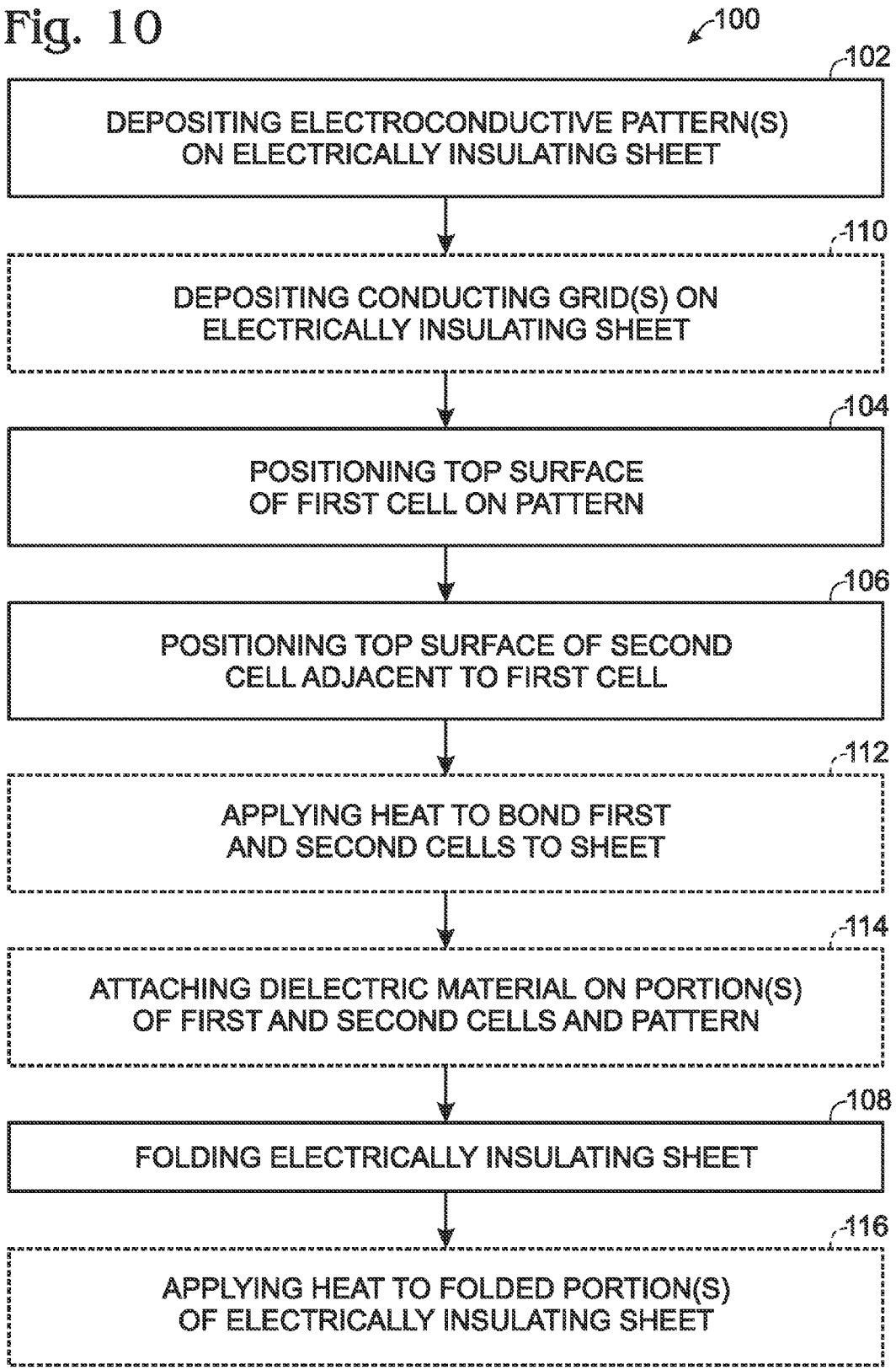

THIN FILM SOLAR CELL STRINGS

CROSS-REFERENCE TO RELATED APPLICATION

This application claims priority from U.S. Provisional Patent Application Ser. No. 61/284,924, filed Dec. 28, 2009, Ser. No. 61/284,958 filed Dec. 28, 2009 and Ser. No. 61/284,956 filed Dec. 28, 2009 all of which are incorporated herein by reference. Also incorporated by reference in their entireties are the following patents and patent applications: U.S. Pat. No. 7,194,197, U.S. Pat. No. 6,690,041, Ser. No. 12/364,440 filed Feb. 2, 2009, Ser. No. 12/424,497 filed Apr. 15, 2009 and Ser. No. 12/587,111 filed Sep. 30, 2009.

BACKGROUND

The field of photovoltaics generally relates to multi-layer materials that convert sunlight directly into DC electrical power. The basic mechanism for this conversion is the photovoltaic effect, first observed by Antoine-César Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates. Additional details relating to the composition and manufacture of thin film PV cells of a type suitable for use with the presently disclosed methods and apparatus may be found, for example, in U.S. Pat. Nos. 6,310, 281, 6,372,538, and 7,194,197, all to Wendt et al. The complete disclosures of those patents are hereby incorporated by reference for all purposes.

As noted previously, a significant number of PV cells often are connected in series to achieve a usable voltage, and thus a desired power output. Such a configuration is often called a "string" of PV cells. Due to the different properties of crystalline substrates and flexible thin film substrates, the electrical series connection between cells may be constructed differently for a thin film cell than for a crystalline cell, and forming reliable series connections between thin film cells poses several challenges. For example, soldering (the traditional technique used to connect crystalline solar cells) directly on thin film cells exposes the PV coatings of the cells to damaging temperatures, and the organic-based silver inks typically used to form a collection grid on thin film cells may not allow strong adherence by ordinary solder materials in any case. Thus, PV cells often are joined with wires or conductive tabs attached to the cells with an electrically conductive adhesive (ECA), rather than by soldering. An example of joining PV cells with conductive tabs is disclosed in U.S. Patent Application Publication No. 2009/0255565 to Britt et al. The complete disclosure of that application publication is hereby incorporated by reference for all purposes.

However, even when wires or tabs are used to form inter-cell connections, the extremely thin coatings and potential flaking along cut PV cell edges introduces opportunities for shorting (power loss) wherever a wire or tab crosses over a cell edge. Furthermore, the conductive substrate on which the PV coatings are deposited, which typically is a metal foil, may be easily deformed by thermo-mechanical stress from attached wires and tabs. This stress can be transferred to weakly-adhering interfaces, which can result in delamination of the cells. In addition, adhesion between the ECA and the cell back side, or between the ECA and the conductive grid on the front side, can be weak, and mechanical stress may cause separation of the wires or tabs at these locations. Also, corrosion can occur between the molybdenum or other coating on the back side of a cell and the ECA that joins the tab to the solar cell there. This corrosion may result in a high-resistance contact or adhesion failure, leading to power losses.

Advanced methods of joining thin film PV cells with conductive tabs or ribbons may largely overcome the problems of electrical shorting and delamination, but may require undesirably high production costs to do so. Furthermore, all such methods—no matter how robust—require that at least some portion of the PV string be covered by a conductive tab, which blocks solar radiation from striking that portion of the string and thus reduces the efficiency of the system. As a result, there is a need for improved methods of interconnecting PV cells into strings, and for improved strings of interconnected cells. Specifically, there is a need for strings and methods of their formation that reduce interconnection costs and reduce the fraction of each PV cell that is covered by the interconnection mechanism, while maintaining or improving the ability of the cell to withstand stress.

SUMMARY

The present teachings disclose thin film PV cells and strings of such cells that may be electrically joined with electrical conductors or electroconductive patterns. The electrical conductors wrap or fold around the PV cells to form an electrical series connection among those cells. The electrical conductors may be formed or deposited on an electrically insulating sheet, which is then wrapped or folded around those cells. By constructing the electrical conductor and positioning the cells appropriately, an electrical connection is formed between one polarity of a given cell and the opposite polarity of the adjacent cell when the sheet is folded over. One or more dielectric materials may be applied or attached to exposed edges of the cells or conductive traces prior to folding the electrical conductors and/or electrically insulating sheet to prevent shorts or failure points.

BRIEF DESCRIPTION OF THE DRAWINGS

FIG. 10 is a flowchart depicting methods of manufacturing strings or modules of photovoltaic cells according to aspects of the present teachings.

DETAILED DESCRIPTION

Figure 1:
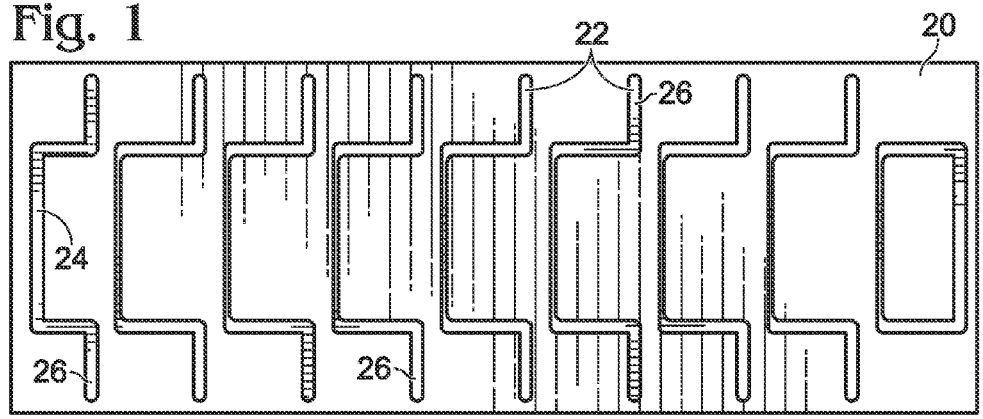
FIG. 1 is a top view of an electrically insulating sheet with electrical conductors in accordance with aspects of the present disclosure.

FIG. 1 shows an electrically insulating substrate or sheet 20 for a string of photovoltaic cells. The sheet may be configured to support a plurality of PV cells. Electrically insulating sheet 20 (also may be referred to as "electrically insulating backing" or "filler sheet") may be made of any suitable materials, such as thermoplastic materials including olefin-based polymers or polyolefins, ethylene vinyl acetate (EVA), ionomers, and fluoropolymers. The electrically insulating sheet may be selected based on its recyclability (separable from other components of a spent PV cell module), lamination time, degradation of manufacturing equipment and PV cells, adhesive properties, vapor permeability, and/or other suitable properties.

Electrically insulating sheet 20 may include electrical conductors or electroconductive patterns 22, as shown in FIG. 1. Electrical conductors 22 may include a trailing portion 24 and one or more leading portions 26. The electrical conductors may be deposited on sheet 20 via printing, plating, and/or other suitable methods. Additionally, electrical conductors 22 may be made of any suitable materials. For example, low-temperature solder (such as tin-bismuth-silver) may be plated on sheet 20 to form the electrical conductors. The solder forms a metallurgical bond with front and backside contacts of the module upon lamination. Alternatively, electrical conductors 20 may be printed using a B-stage conductive epoxy. Alternatively, nickel may be plated on sheet 20 to form electrical conductors 22 and conductive epoxy or solder paste may be added in certain areas to ensure electrical contact. The electrical conductors may be deposited on only a single side of sheet 22.

Figure 2:
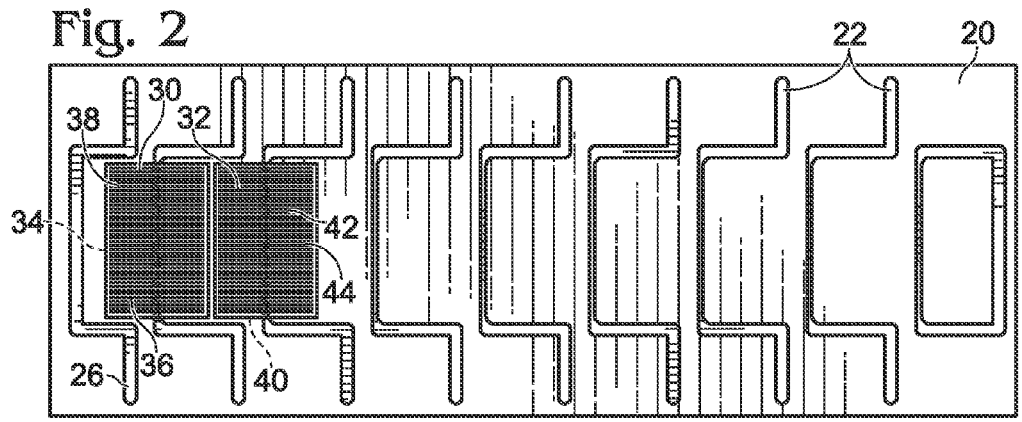
FIG. 2 is a top view of the electrically insulating sheet of FIG. 1 shown with first and second PV cells supported on the sheet aligned with trailing portions of the electrical conductors.
Figure 3:
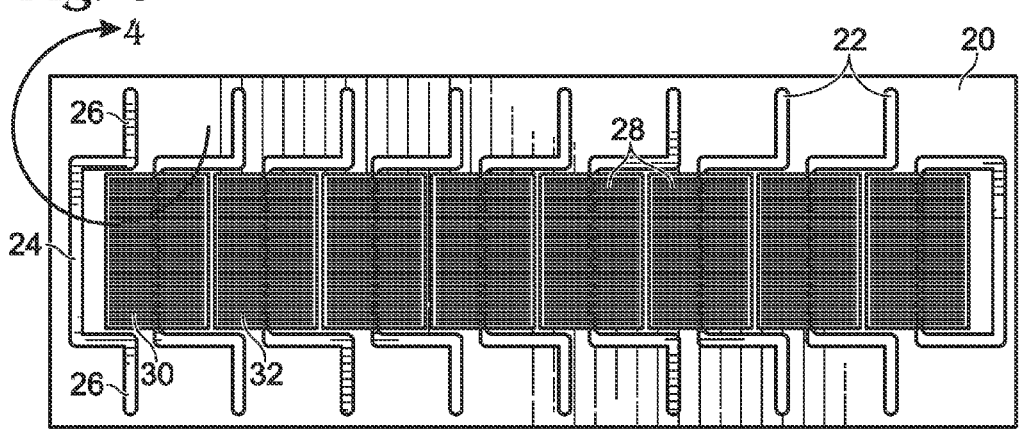
FIG. 3 is a top view of the electrically insulating sheet of FIG. 1 shown with PV cells supported on the sheet and aligned with trailing portions of the electrical conductors.

FIGS. 2-3 show placement of thin film PV cells 28, such as a first thin film PV cell 30 and a second thin film PV cell 32 on sheet 20. First cell 30 includes a top surface 34, a bottom surface 36, and a conducting grid 38. Similarly, second cell 32 includes a top surface 40, a bottom surface 42, and a conducting grid 44. Top surface 34 of first cell 30 is positioned on trailing portion 24 of electrical conductor 22 such that the trailing portion contacts top surface 34 and/or conducting grid 38. Top surface 40 of second cell 32 is positioned adjacent to but spaced from the first cell, such as on the trailing portion of an adjacent electrical conductor such that that trailing portion contacts top surface 40 and/or conducting grid 44. The cells may be heat-tacked on or otherwise attached to the sheet. Although the first and second cells are shown to include conducting grids, those grids may alternatively be deposited on sheet 20 as part of electrical conductors 22.

Figure 4:
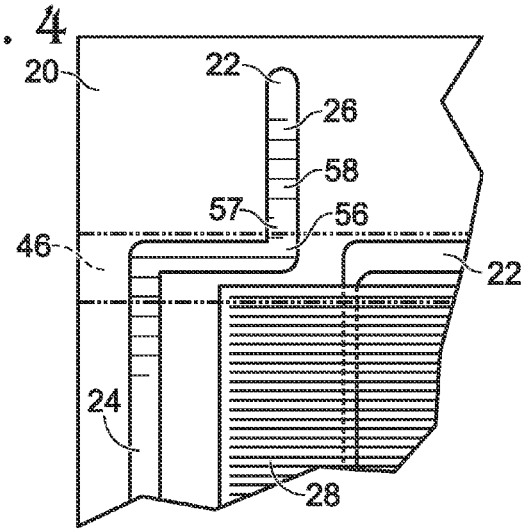
FIG. 4 is a partial view of the electrically insulating sheet of FIG. 3 shown with dielectric material attached to portions of the electrical conductors and cells.

FIG. 4 shows dielectric material 46 that may be attached to portions of electrical conductors 22 and cells 28 of sheet 20 to protect against short circuits or failure points. The dielectric material may be attached via taping, printing, coating, or other suitable methods prior to folding sheet 20. Dielectric material 46 may be any suitable shape(s), such as a linear stripe shown in FIG. 4.

Figure 5:
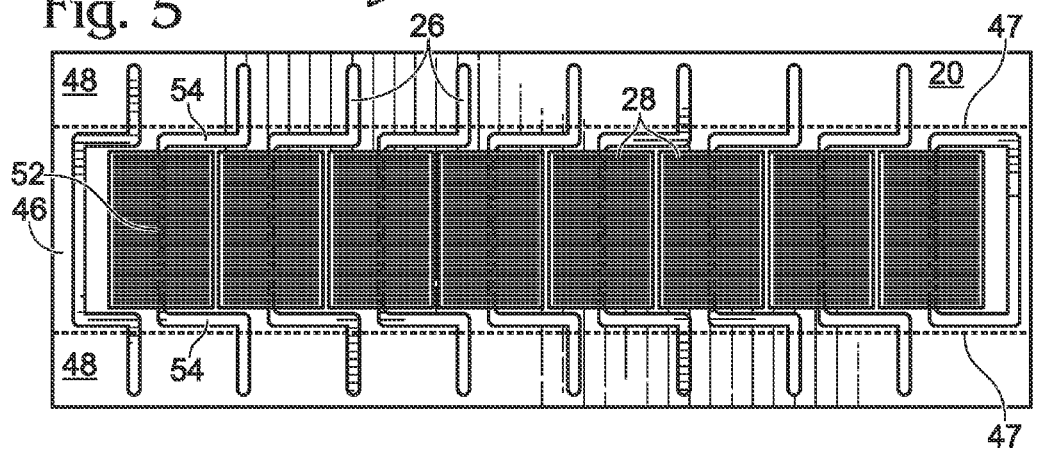
FIG. 5 is a top view of the electrically insulating sheet of FIG. 1 with dashed lines to indicate where the electrically insulating sheet will be folded.

FIG. 5 shows, in dashed lines at 47, where sheet 20 may be folded to connect leading portions 26 to bottom surfaces of cells 28. Sheet 20 may be referred to as having a base portion 46 that includes the cells and the trailing portions of the electrical conductors, and one or more folded portions 48 that are folded on to the base portion. Although sheet 20 is shown to include two folded portions, the sheet may alternatively include any suitable number of folded portions. For example, sheet 20 may include a single folded portion that covers any suitable part(s) of the base portion when folded.

Figure 6:
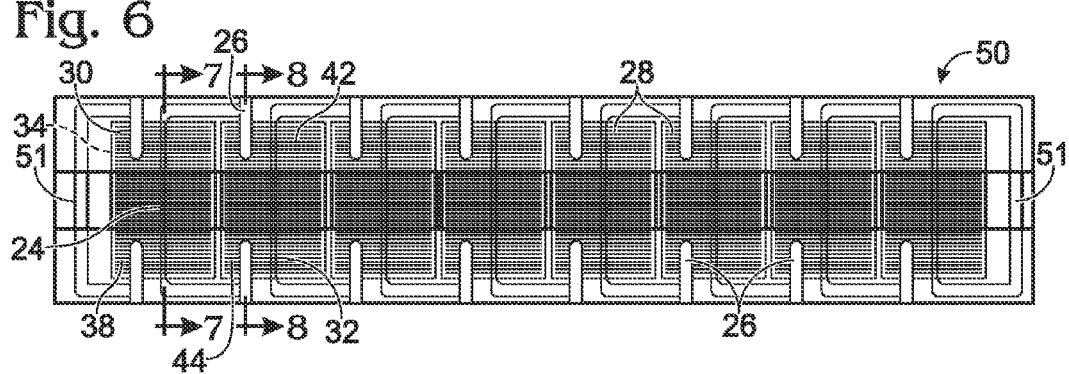
FIG. 6 is a top view of the electrically insulating sheet of FIG. 1 with portions of the electrically insulating sheet folded along the dashed lines shown in FIG. 5.

FIG. 6 shows sheet 20 with folded portions in which leading portions 26 contact bottom surfaces of cells 28 to form electrical series connections among cells 28 resulting in a string of connected PV cells 50. For example, trailing portion 24 contacts top surface 34 of first cell 30 such that the trailing portion is electrically connected to conducting grid 38 of the first cell. Additionally, leading portion 26 contacts bottom surface 42 of second cell 32 such that the leading portion is electrically connected to conducting grid 44 of the second cell. Electrical conductors 22 at end portions of sheet 20 are exposed at 51 to provide positive and negative contacts for the cell. The folded portions of sheet 20 may be heat-tacked or otherwise attached to cells 28.

Figure 7:
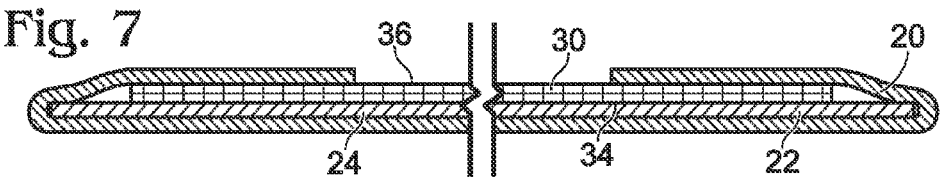
FIG. 7 is sectional view of the electrically insulating sheet of FIG. 1 taken along lines 7-7 in FIG. 6.
Figure 8:
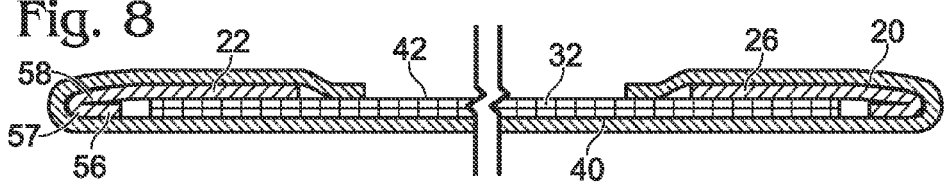
FIG. 8 is a sectional view of the electrically insulating sheet of FIG. 1 taken along lines 8-8 in FIG. 6.

FIGS. 7-8 show sheet 20 and leading portion 26 of electrical conductor 22 wrapping or folding around second cell 32. Trailing portion 24 is adjacent top surface 34 and spaced from bottom surface 36 of first cell 30, such as within a plane parallel to the bottom surface. The trailing portion includes a first part 52 that may extend longitudinally across the cell and one or more second parts 54 that may extend transversely across the cell toward an adjacent cell (shown in FIG. 5). From the trailing portion to the leading portion, electrical conductor 22 wraps or folds around the second cell such that at least a substantial portion of leading portion 26 is adjacent bottom surface 42 and spaced from top surface 40 of second cell 32 (such as within a plane parallel to the top surface) relative to the trailing portion. Leading portion 26 may extend longitudinally along the second cell when folded. The leading portion includes a first part 56, a second part 57, and a third part 58. Prior to folding sheet 20, first part 56 is spaced from third part 58 by second part 57 (such as shown in FIG. 4). When sheet 20 is folded, first part 56 is in contact with third part 58, as shown in FIG. 8. This may provide redundant contact to prevent the folded portion of the electrical conductor from becoming a failure point.

Figure 9:
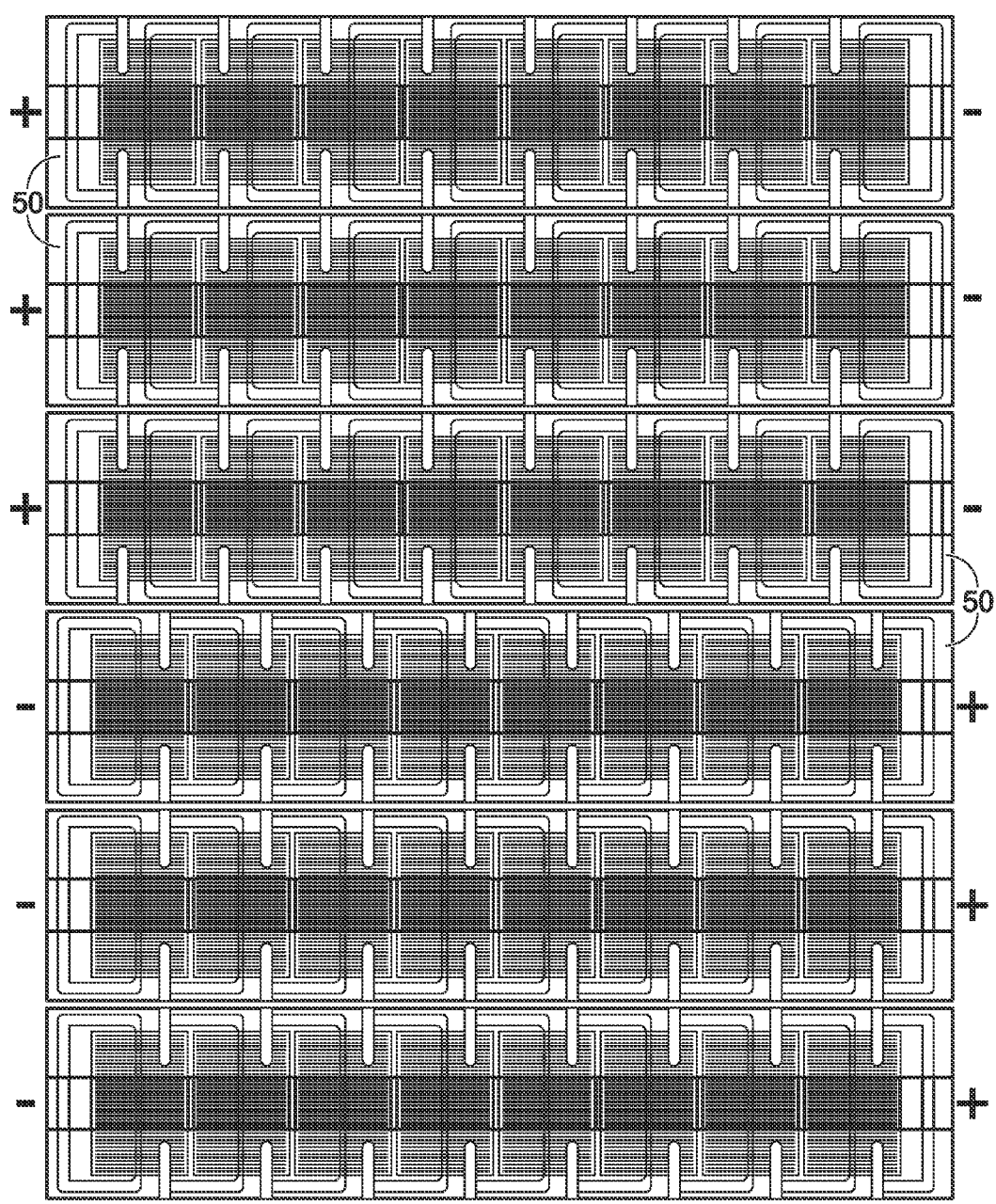
FIG. 9 is a top view of six strings of PV cells prior to connection and lamination.

FIG. 9 shows a plurality of strings 50 prior to lamination as a module 60. As part of the lamination, the strings are electrically connected, such as via connection ribbons. For example, a first connection ribbon may connect the left side of the upper three strings in FIG. 9 as the positive module connection. A second connection ribbon may connect the left side of the lower three strings in FIG. 9 as the negative module connection. Finally, a third ribbon may connect all six strings on the right side to place the upper group of three strings and lower group of three strings in a series connection. Strings 50 may alternatively be connected via other suitable method(s).

A number of methods of manufacturing strings and modules of PV cells are contemplated by the present teachings, and an illustrative method is depicted in FIG. 10 and generally indicated at 100. While FIG. 10 shows illustrative steps of a method according to one embodiment, other embodiments may omit, add to, and/or modify any of the steps shown in that figure. At step 102, electroconductive pattern(s) are deposited on an electrically insulating sheet, such as via printing or plating. At step 104, the top surface of a first cell is positioned on an electroconductive pattern. The top surface of the first cell may be positioned on a trailing portion of the pattern. At step 106, the top surface of a second cell is positioned adjacent to, but spaced from, the first cell. The top surface of the second cell may be positioned on a trailing portion of an adjacent electroconductive pattern. At step 108, the sheet is folded such that one or more leading portions of the electroconductive pattern contacts the bottom surface of the second cell to form an electrical series connection between the first and second cells.

Method 100 also may include one or more other steps. For example, at step 110, conducting grids are deposited on the electrically insulating sheet where the first and second cells will be positioned. The conducting grids may be deposited via printing, plating, or other suitable methods. At step 112, heat is applied to bond the first and second cells to the sheet. At step 114, dielectric material is attached to portion(s) of the first and second cells and the pattern. At step 116, heat is applied to folded portion(s) of the sheet to bond those portions to the first and second cells.

The various structural members disclosed herein may be constructed from any suitable material, or combination of materials, such as metal, plastic, nylon, rubber, or any other materials with sufficient structural strength to withstand the loads incurred during use. Materials may be selected based on their durability, flexibility, weight, and/or aesthetic qualities.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A thin film photovoltaic module, comprising:
    first and second thin film photovoltaic cells, each cell having a top surface and a bottom surface; and
    an electrical conductor having a trailing portion including a first part extending longitudinally across the first cell and a second part extending transversely toward the second cell, and a leading portion extending longitudinally along the second cell, the first part of the trailing portion contacting the top surface of the first cell, the second part of the trailing portion disposed out of physical contact with each cell, and the leading portion wrapping around into contact with the bottom surface of the second cell to form an electrical series connection between the first and second cells;
    wherein the leading portion includes a first unfolded part, a second part that spans a fold, and a third part folded into direct contact with the first unfolded part to provide redundant contact to prevent the fold from becoming a failure point.

2. The module of claim 1, further comprising an electrically insulating sheet on which the electrical conductor is supported.

3. The module of claim 2, wherein the electrically insulating sheet wraps around the second cell.

4. The module of claim 3, wherein the electrically insulating sheet includes one or more olefin-based polymers.

5. The module of claim 3, wherein the electrically insulating sheet includes conducting grids that contact a portion of the first and second cells.

6. The module of claim 1, wherein the first cell includes a first conducting grid and the second cell includes a second conducting grid.

7. The module of claim 6, wherein the trailing portion is electrically connected to the first conducting grid and the leading portion is electrically connected to the second conducting grid.

8. The module of claim 1, further comprising dielectric material disposed on a portion of the electrical conductor and the first and second cells.

9. A string of thin film photovoltaic cells, comprising:
    first and second thin film photovoltaic cells, each cell having a top surface and a bottom surface;
    an electrically insulating sheet configured to support the first and second cells; and
    an electrical conductor disposed on the electrical insulating sheet and having trailing and leading portions, wherein the trailing portion includes a first part extending longitudinally across the first cell and a second part extending transversely toward the second cell while out of physical contact with both cells, the leading portion extends longitudinally along the second cell and includes a first unfolded part, a second part that spans a fold and a third part, and the electrically insulating sheet folds around the second cell such that the first part of the trailing portion is electrically connected to the top surface of the first cell and the third part of the leading portion is electrically connected to the bottom surface of the second cell to form an electrical series connection between the first and second cells, and the third part of the leading portion is folded into direct contact with the first unfolded part of the leading portion to provide redundant contact to prevent the fold from becoming a failure point.

10. The string of claim 9, wherein the electrical insulating sheet includes conducting grids that are electrically connected to at least a portion of the first and second cells.

11. The string of claim 9, wherein the first cell includes a first conducting grid electrically connected to the trailing portion, and the second cell includes a second conducting grids electrically connected to the leading portion.

* * * * *